US007400129B1

(12) United States Patent
Prather

(10) Patent No.: US 7,400,129 B1
(45) Date of Patent: Jul. 15, 2008

(54) MEASUREMENT OF DISTORTION IN AN AMPLIFIER

(75) Inventor: Scott Prather, Seattle, WA (US)

(73) Assignee: AT&T Mobility II LLC, Atlanta, GA (US)

( * ) Notice: Subject to any disclaimer, the term of this patent is extended or adjusted under 35 U.S.C. 154(b) by 0 days.

(21) Appl. No.: 11/480,724

(22) Filed: Jun. 30, 2006

(51) Int. Cl.
*G01R 23/00* (2006.01)
(52) U.S. Cl. .................................... 324/76.19
(58) Field of Classification Search .............. 324/76.19
See application file for complete search history.

(56) References Cited

U.S. PATENT DOCUMENTS

| | | | | |
|---|---|---|---|---|
| 6,246,865 B1 * | 6/2001 | Lee | ............................. | 375/296 |
| 6,263,289 B1 * | 7/2001 | Hassun et al. | ................. | 702/69 |
| 6,859,099 B2 * | 2/2005 | Akaiwa | ...................... | 330/149 |
| 2005/0184803 A1 * | 8/2005 | Hirose et al. | ................ | 330/149 |
| 2006/0039498 A1 * | 2/2006 | de Figueiredo et al. | ..... | 375/297 |

OTHER PUBLICATIONS

"Distortion Test Suite Software: Technical Overview," Agilent Technologies, 2005, 89604A/89604AN, 1-8.

Eckert, H., "Check Nonlinear Distortion with a Vector Signal Analyzer: Versatile vector signal analyzers can be used to study distortion on burst signals from base stations even while radio network is still operational," Microwaves and RF, Jan. 2004, downloaded Sep. 6, 2006, 4 pages.

"Measuring the Nonlinearities of RF Amplifiers Using Signal Generators and a Spectrum Analyzer," Rohde and Schwarz GmbH and Co., Mar. 2006, 1-36.

"Noise Figure Measurements on Amplifiers in Pulsed Mode," Rohde and Schwarz GmbH and Co., Dec. 2000, 1-7.

"Testing Power Amplifiers for 3G Base Stations," Rohde and Schwarz GmbH and Co., Sep. 2002, 1-36.

Zilliox, P., "Lessons Learned Designing Linear High Power Ka-Band Uplinks for Broadband Satellite Gateway Earth Stations," Andrew: One Company, A World of Solutions, 8 pages.

\* cited by examiner

*Primary Examiner*—Anjan Deb
*Assistant Examiner*—Timothy J Dole
(74) *Attorney, Agent, or Firm*—Woodcock Washburn LLP

(57) ABSTRACT

Parametric measurement of first- and second-generation telecommunications equipment has been relatively straightforward. The evolution to more complex transmission schemes such as those proposed for third-generation (3G) telecommunications devices can employ the subject methods and apparatus and apply AM-PM test procedures to a multicarrier amplifier RF environment to properly characterize the parametric performance of these transmission systems, particularly those operating in a multicarrier environment.

18 Claims, 4 Drawing Sheets ns in which:
MEASUREMENT OF DISTORTION IN AN AMPLIFIER

FIELD OF THE INVENTION

The invention is generally directed to apparatus and methods for measuring distortion in amplifiers.

BACKGROUND OF THE INVENTION

The characterization of a telecommunications device's parametric performance is a vital aspect of the product development, verification and acceptance process. Proper parametric characterization will reveal hardware and software faults that may have a substantial effect of the product performance that might otherwise go unnoticed until the equipment is deployed in the field. Historically, the execution of a parametric test suite on first and second generation linear amplifiers has been relatively simple, primarily because of the low crest factors of the signals involved and the single carrier per amplifier base station architecture. The nature of transmitter test methodologies changed substantially with the introduction of high crest factor modulation schemes such as CDMA and OFDM, and will change further as the communications industry continues moving toward multicarrier amplifier schemes.

Historically, the measurement of transmitter output power was a relatively simple matter. The constant-envelope modulation schemes used in first-generation analog equipment allowed the use of simple square-law detectors or thermal power measurement devices. The introduction of non constant-envelope digital modulation in TDMA systems complicated the measurement of output power slightly, however, this was easily accommodated by test equipment manufacturers because of the relatively low peak to average power ratio.

SUMMARY OF THE INVENTION

In consideration of such needs in the art, the invention provides systems and methods for improved transmitter test systems and methodologies.

Other features of the invention are described in more detail below.

BRIEF DESCRIPTION OF THE DRAWINGS

The apparatus and methods for measuring distortion in amplifiers in accordance with aspects of the invention are further described with reference to the accompanying drawings in which.

DETAILED DESCRIPTION OF ILLUSTRATIVE EMBODIMENTS

With the deployment of multicarrier amplifiers and higher-order (non constant-envelope) modulation schemes, the concept of power measurement takes on a different meaning. It is no longer possible to use simple average-reading power detection systems. Instead, high-speed detectors become the rule, and because of the higher peak-average ratios inherent in the more complex modulation schemes, a means of defining output power both as an average as well as a peak value becomes crucial.

As used herein, peak power is the peak envelope power (Vpk2/2R), not instantaneous peak power (Vpk2/R). Accurate measured and expected values depends on this distinction. For example, a Continuous Wave (CW) signal has a peak envelope power peak to average ratio of 0 dB, while this same CW signal has an instantaneous peak to average power ratio of 3 dB.

Spectrum analyzers are typically calibrated in terms of RMS-equivalent power, so RF envelope power measurements (made in the time domain using zero-span, for example) quantify peak envelope power in terms of an RMS equivalent. So, peak power measurements as used herein refers to Peak Envelope Power (PEP).

Peak power can be difficult to determine in an RF environment with a high peak/average ratio. For example, the value of peak RF power in a complex-modulation environment (such as CDMA) typically follows a nearly Gaussian distribution. Since the behavior can be modeled according to a Gaussian distribution, peak power can be defined in terms of statistical likelihood that it will be above (or below) the average power of the device under test (DUT). Consequently, the peak power handling requirements of power amplifiers may be specified by the statistical occurrence of any given peak power level above the average.

Figure 1:
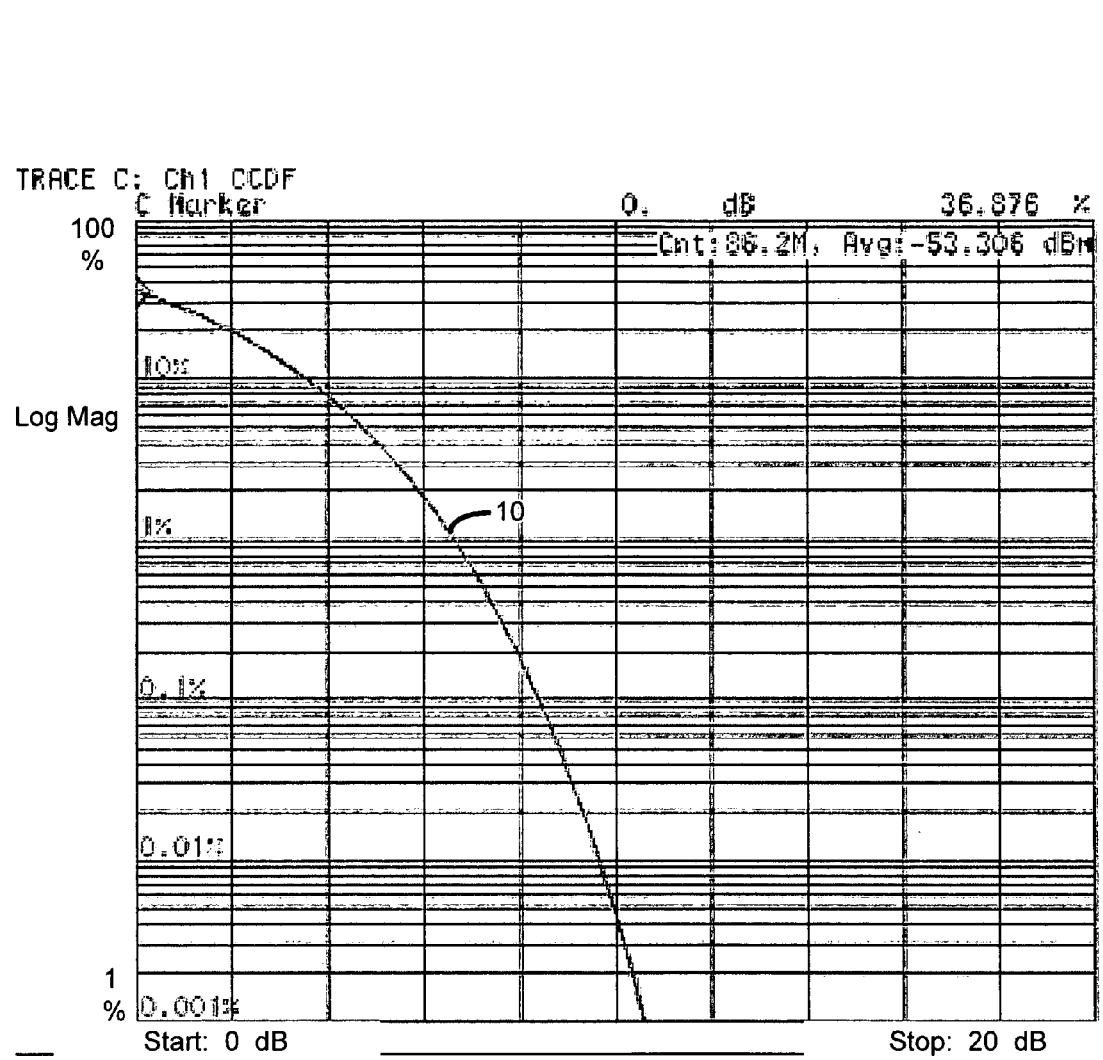
FIG. 1 depicts a complimentary cumulative distribution function of thermal Gaussian noise.

For example, given an input stimulus of ideal Gaussian noise feeding an ideal linear power amplifier providing an average output power of +30 dBm, peaks of +36.5 dBm will occur 1% of the time (note that a peak to average power of $\leq 6.5$ dB at 99% probability ($3\sigma$) is 3 dB below the standard definition for the peak to average ratio of Gaussian noise at 99% ($\leq 9.5$ dB. As described earlier, this is attributable to the difference between a measurement made in terms of instantaneous peak power ($V_{pk}^2/R$) and peak envelope power ($V_{pk}^2/2R$)), while peaks of +40 dBm will occur only 0.004% of the time (see curve 10 in FIG. 1). Consequently, the peak allowable RF output power must be determined based on probability of occurrence.

Determining the peak allowable RF output power based on probability of occurrence is a consideration when specifying the power-handling capabilities of a linear amplifier. The average power rating of an amplifier is important when evaluating power dissipation, transmission line and antenna continuous power handling requirements, etc. Peak power becomes important when evaluating transmitter intermodulation due to transient peaks, as well as transmission line and antenna peak power ratings. Proper characterization of a signal's statistical peak-average power ratio can be used to minimize wasted power in linear amplifiers due to excessive back-off, as well as providing the system engineer with a better knowledge of the peak power requirements of a given transmission system.

When a linear power amplifier is presented with an input stimulus with a high peak/average ratio (such as Gaussian noise), unless the amplifier is extremely linear, a certain percentage of RF power peaks will be clipped. This clipping results in the production of intermodulation products, which create "spectral regrowth" outside the desired transmitter passband. By knowing the statistical peak to average power distribution of the input stimulus and the peak-power limiting characteristics of the linear power amplifier, the performance of any combination of hardware can be evaluated, and readily compared.

An example of a test instrument capable of supporting statistical power measurements is the Vector Signal Analyzer (VSA). Typically, a VSA is capable up supporting a wide array of parametric measurements applicable to any transmission platform, and it can be especially useful when performing statistical RF power measurements. For any given input signal within its range, a VSA can be configured to display the time-domain RF power envelope, the frequency-domain spectral composition, the time-domain average power, the time-domain peak envelope power (at a user-specified probability of occurrence), and the peak/average ratio (in dB). In addition, a VSA is capable of providing the user with a real-time display of the input signal's peak power (in dB) above the average power, expressed as likelihood of occurrence. This data may be presented in the form of a Cumulative Distribution Function (CDF) or a Complimentary Cumulative Distribution Function (CCDF).

A VSA's statistical power measurement capabilities provide a simple means of evaluating the peak power characteristics of any RF power chain. The methodology used to incorporate a VSA along with a spectrum analyzer into a product development or acceptance process is described below.

When setting out to quantify the performance of a linear power amplifier (LPA), test engineers have resorted to methods that use a two-tone stimulus. There are many advantages to this approach, chief among them being the fact that such a test is reasonably simple to set up and execute, and the cost of the requisite equipment is low. When properly executed, the two-tone test is fairly effective in determining the levels of intermodulation products produced in the amplifier under test. However, in today's communications environment, this approach is woefully inadequate.

The general trend in communications systems (particularly in base station equipment) has been towards a multicarrier RF environment. This is true no matter what the physical airlink design, be it CDMA, OFDM, or TDMA. In fact, there's a strong movement in the wireless communications industry to replace expensive and power-consuming transmitter combiners with multicarrier amplifiers.

Quantifying linear amplifiers for multicarrier operation requires a test methodology that goes beyond the typical two-tone IM product test. Instead, the test methodology for such equipment must include the use of a test stimulus capable of accurately replicating the characteristics of the real-world input signal.

Consider, for example, the theoretical peak power produced by a multitone amplifier. This example, uses an input stimulus of 16 tones, each of which has an identical power of +20 dBm and random phase among tones. The total average power of these 16 tones is given by Equation 1.1:

$$P_{Average(total)} = [P_{Average(PerTone)} + 10 \log_{10}(N)] \quad (Eq\ 1.1)$$

Substituting our average input power/tone of +20 dBm and N=16 tones results in: $P_{Average(Total)} = (+20\ dBm + 10 \log_{10}(16)) = +32\ dBm$.

A general expression for calculating theoretical peak power is given in Equation 1.2:

$$P_{Peak} = [P_{Average(PerTone)} + 10 \log_{10}(N)^2] \quad (Eq\ 1.2)$$

Substituting +20 dBm average power per tone and N=16 tones results in: $P_{Peak} = (+20\ dBm + 10 \log_{10}(16)^2) = +44.1$ dBm. This peak power level will only occur if all 16 tones were to add perfectly in phase at the same instant.

Since total average power from Equation 1 was +32 dBm, and the peak power for our example was +44.1 dBm, the peak/average ratio for these 16 tones would be: 44.1 dBm−32 dBm=12.1 dB.

For low values of N (say, N<10), Equation 1.2 estimates the peak power fairly well. However, for large values of N, Equation 1.2 provides results that are typically conservative. In the example above, it is unlikely that with N=16 at a power/tone of +20 dBm, the peak to average ratio would ever reach 12.1 dB. In a multitone environment where N>10, we may apply the central limit theorem and state that the peak to average power distribution takes on the characteristics of Gaussian noise, provided that the phase of each individual tone is truly random and uncorrelated with any of the other tones.

The random and uncorrelated phase requirement is an important aspect to consider, as signals with deterministic phase relationships will skew the peak-average ratio away from a Gaussian distribution. This factor is important not only from a test standpoint, but from an operational and specification standpoint as well, since it will increase the linearity requirements of a multitone amplifier.

Applying the Gaussian power distribution to the previous example of N=16 tones at a power of +20 dBm/tone, the peak power requirements are reduced somewhat. For example, instead of designing to a theoretical worst-case peak to average ratio of 12.1 dB, it can be determined that the peak to average ratio will exceed 10 dB only 0.004% of the time and design accordingly.

Consider a conventional two-tone test stimulus that may be applied to a single-frequency amplifier for the purpose of measuring intermodulation distortion. For this test, two sinusoidal tones $\omega_1$ and $\omega_2$ of identical amplitude and random phase ($\phi_1$ and $\phi_2$ are identically and independently distributed, with a uniform distribution between 0 and $2\pi$) are used to provide the input stimulus to the amplifier under test. The amplifier will produce inband third-order responses at:

$$2\omega_1 - \omega_2$$

$$2\omega_2 - \omega_1$$

The amplifier will produce inband fifth-order responses at:

$$3\omega_1 - 2\omega_2$$

$$3\omega_2 - 2\omega_1$$

In the case of a two-tone stimulus, there are no intermodulation products that fall between the two tones. Therefore, evaluation of the amplitude of the resultant intermodulation products is relatively straightforward because these products fall on either side of the fundamental tones that produced them. In other words, a two-tone stimulus will only produce adjacent-channel intermodulation products. In a two-tone test, the phase contribution of $\omega_1$ and $\omega_2$ on the generation of intermodulation is negligible, and therefore the resulting intermodular power can be considered as a reference.

If a stimulus consisting of more than two tones is used, the effects of each tone's frequency and phase have a great impact on the levels of resulting intermodulation distortion (IMD). For example, an amplifier that is presented with an input stimulus of three equally spaced, identical amplitude sinusoidal tones will produce the following worst-case third-order products:

$$\omega_1 + \omega_2 - \omega_3$$

$$\omega_1 - \omega_2 + \omega_3$$

The inband third-order products that result from this three-tone stimulus are significant because they are 6 dB above the third-order products that result from a two-tone stimulus. This is because the third-order products produced by three tones are not dependent upon the second harmonic of one of the input tones as is the case in a two-tone IMD test. Needless to say, when harmonics of the input tones are taken into account, three tones produce substantially more IM products than the three combinations listed above.

Unlike the above-referenced two-tone stimulus, three or more tones produce intermodulation products that fall on or between the fundamental tones (on-channel interference) and on either side of the tone suite (adjacent-channel interference). Consequently, the analysis of IM distortion in a multitone system should include a means for quantifying the level of both on-channel and adjacent-channel intermodulation distortion.

Instead of discrete tones, if a bandlimited Gaussian noise stimulus was input to the amplifier under test, a near infinite number of intermodulation products will be produced. As a result, the intermodulation performance of an amplifier can be easily characterized using this stimulus, which very closely simulates that of the actual input signal.

However, the accuracy of using bandlimited Gaussian noise as a test stimulus is dependent upon the statistical characteristics of the actual input stimulus. Preferably, in such a test stimulus the phase of each tone is totally random and uncorrelated.

Figure 2:
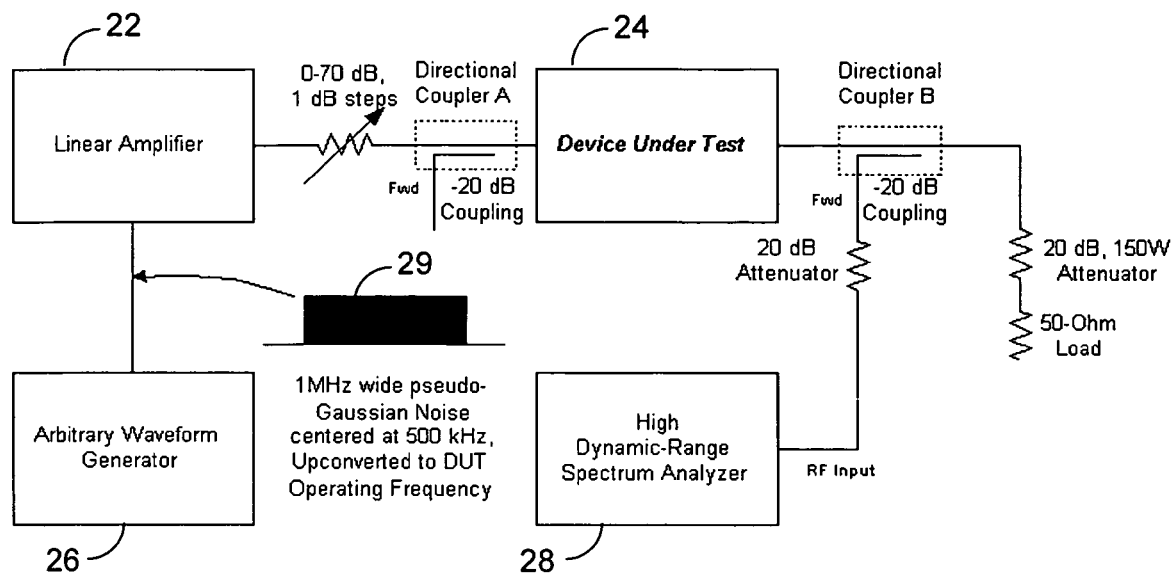
FIG. 2 depicts an exemplary Gaussian noise test configuration.

To execute an intermodulation test using bandlimited Gaussian noise, a configuration such as that shown in FIG. 2 may be used. As FIG. 2 illustrates, an arbitrary waveform generator (AWG) 26 is used to synthesize a bandlimited Gaussian noise source 29, which provides the input stimulus for the DUT 24. A synthesized noise source is preferred for the following reasons:

The noise bandwidth can be defined quite precisely, with "brick wall" edges

The noise stimulus has known statistics that are repeatable and do not degrade over time An AWG's program is easily modified to support NPR tests The software-driven nature of the AWG makes it well suited to a production or automated test environment Preferably, an analog Gaussian noise generator and an analog bandpass filter with a very low shape factor should be used to provide the input stimulus. However, a bandpass filter with acceptable characteristics would be very difficult to build, and measurement repeatability would be questionable over time and temperature. The AWG 26 approach described herein provides a preferred bandlimited noise-like stimulus.

Essentially, AWG 26 is programmed to generate N equally-spaced sinusoidal tones of the form $x(t)=A_n \cos(\omega t+\phi)$ within the desired test bandwidth.

The sinusoids are evenly spaced at a user-defined frequency of $\Delta\omega$, typically chosen to be about $2\pi 1000$ Hz. The integer number of tones N required for a given bandwidth is defined by Equation 1.3:

$$N = \frac{2\pi(\text{Bandwidth}_{\text{Hz}})}{\Delta\omega} \quad \text{(Eq 1.3)}$$

The positive frequencies of these tones are described in Equation 1.4 below:

$$\omega_n = \omega_0 + (n-1)\Delta\omega; \quad (1 \leq n \leq N) \quad \text{(Eq 1.4)}$$

The output signal x(t) of the AWG is described in Equation 1.5:

$$x(t) = \sum_{n=1}^{N} A_n \cdot e^{j(\omega_n t + \phi_n)} \quad \text{(Eq 1.5)}$$

The phase component $\phi_n$ must be random and independently distributed such that $0 \leq \phi \leq 2\pi$.

A disadvantage to using AWG 26 to generate bandlimited Gaussian noise 29 is that it is a finite-state machine, so depending upon the amount of available memory, the AWG's pseudo-random phase between tones will repeat. While this effect is typically minor, it should be taken into account when using an AWG, as the error could have an effect on intermodulation product levels (which follow a non-linear relationship with the input power level depending upon their order). For example, a 0.3 dB deviation from the Gaussian curve 10 at the fundamental frequency will correspond to a 0.9 dB amplitude error of the third-order product, a 1.5 dB error for the fifth-order product, etc.

The test circuit shown in FIG. 2 assumes that the AWG's 26 baseband noise signal 29 be up converted to the DUT's 24 operating frequency. Any conventional up-conversion scheme may be utilized, such as a low-noise signal generator (to provide a local oscillator) and a balanced diode mixer. In the event that the DUT 24 requires a drive level above that which the up-conversion scheme is capable of providing, a low-power linear amplifier 22 may be included.

Before executing this test on the DUT 24, the linearity of the test stimulus should be established. This is easily accomplished by increasing the power level of the bandlimited noise stimulus until the rated average output power of the DUT 24 is established. With the VSA connected to directional coupler A and the input signal level properly optimized, a CDF or CCDF is invoked. The CDF or CCDF is allowed to run until $10^6$ samples have been accumulated. The resulting statistical distribution is compared with the Gaussian curve, and any non-linearity (indicated by a departure from the ideal Gaussian curve) noted.

Once the input stimulus has been characterized, characterization of the DUT 24 involves repetition of the process used to quantify the performance of the up-converted signal, with the VSA 28 connected to directional coupler B.

Once CDFs or CCDFs for directional coupler A and directional coupler B have been obtained and stored, review of these plots will quickly reveal the peak power level at which compression is taking place, as well as its severity.

The DUT's 24 adjacent-channel power ratio (ACPR) is defined as the integrated power in the channel bandwidth divided by the integrated power in the adjacent channel within the same bandwidth.

The IMD test methodology described herein displays a continuous spectrum based on the input stimulus, therefore, it is relatively straightforward to convert the integrated noise power measurements into any desired bandwidth. The ability to make such a conversion is relevant when comparing the DUT's 24 IMD performance to a pre-defined spectral mask.

Figure 3:
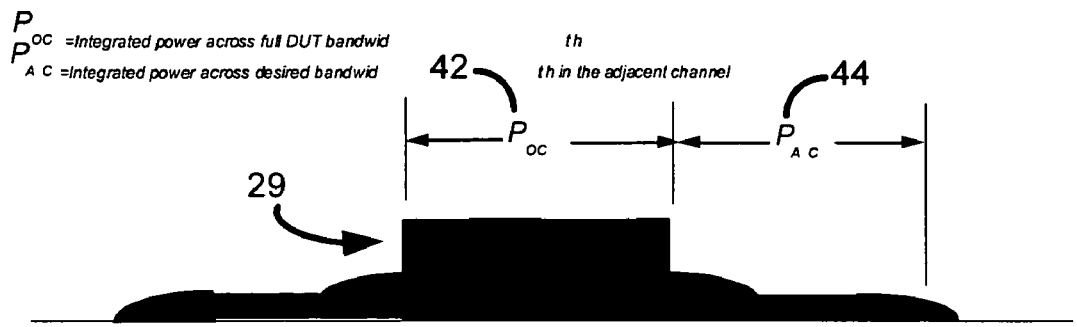
FIG. 3 depicts an exemplary adjacent-channel power ratio calculation using Gaussian noise stimulation.

An integrated power measurement across the DUT's 24 entire bandwidth will yield the average power of the DUT 24 ($P_{OC}$ 42 in FIG. 3). After measuring the on-channel power, measurement of the integrated noise power in the adjacent channel ($P_{AC}$ 44 in FIG. 3) is accomplished using a high dynamic-range spectrum analyzer (e.g., 28 in FIG. 2) with frequency-domain band-power markers.

Once $P_{OC}$ 42 and $P_{AC}$ 44 are known, the ACPR is calculated using Equation 1.6:

$$ACPR_{(db)} = \qquad \text{(Eq 1.6)}$$
$$P_{OC}(dBm) - \left(P_{AC}(dBm) + 10\log_{10}\left(\frac{\text{Bandwidth}_{OC}(\text{Hz})}{\text{Bandwidth}_{AC}(\text{Hz})}\right)\right)$$

An adjacent-channel test begins by evaluating the intermodulation products present in the input stimulus 29 as monitored by directional coupler A (see FIG. 2). This may be accomplished using any spectrum analyzer capable of supporting a minimum of 90 dB on-screen dynamic range. Because the noise stimulus 29 displays a continuous spectrum, making an integrated power measurement across any desired bandwidth and comparing it to the integrated power in the same bandwidth of the adjacent channel will yield a measurement of IMD from the DUT 24, expressed in dBc. This measurement will be quite accurate provided that the adjacent-channel IMD from the input stimulus well above (>20 dB) the measuring instrument's noise floor.

A slight frequency gap (of about 10% or less of the stimulus bandwidth) may be allowed between the band-power markers used to measure the integrated on-channel power and the integrated power measured in each adjacent channel. This frequency gap compensates for the spectrum analyzer filter shape factor, and greatly improves the accuracy of this measurement. The value of the frequency gap between the band-power markers can be determined empirically for the specific spectrum analyzer and resolution bandwidth employed during the measurement.

Once the band power markers have been set up and the input stimulus has been analyzed, the resulting trace could be saved to an internal data register within the spectrum analyzer 28 so that it can be compared with the output spectrum of the DUT 24.

Characterization of the DUT 24 involves repetition of the process used to quantify the performance of the up-converted signal, with the spectrum analyzer connected to directional coupler B (see FIG. 3). Saving the DUT's 24 frequency-domain data to a second data register in the spectrum analyzer 28 will allow the traces to be overlaid, allowing direct visual comparison of the DUT's 24 input and output spectra.

From an RF-compatibility perspective, an important aspect of an amplifier's performance is its ability to raise input signals to the desired output power level without a significant amount of spectral regrowth in adjacent channels. The inputs signal's peak/average characteristics, along with the transfer characteristics of the amplifier, dictate the degree to which undesired spectral components will appear at the LPA output. Previously, evaluation of amplifier distortion products has been achieved through the use of two-tone measurements which yield adjacent-channel IMD results, because a two-tone stimulus is incapable of producing IMD between the two input tones. However, in a multicarrier environment, IMD products are produced in the adjacent channel as well as within the transmitter's bandpass (on-channel interference). These on-channel IMD products can have a substantial influence on the receiver's bit error rate.

Figure 4:
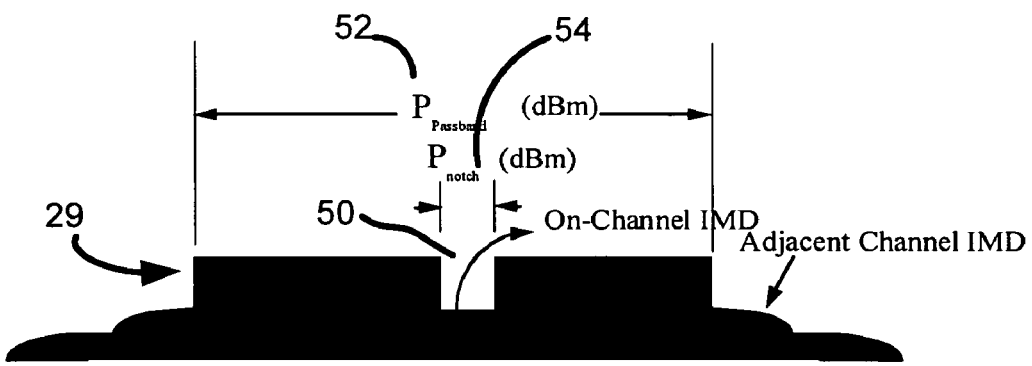
FIG. 4 depicts in graphic form noise power ratio measurement definitions.

Measuring on-channel IMD is not a trivial matter. As illustrates in FIG. 4, one accepted method of making this measurement involves the use of a bandlimited analog Gaussian noise source 29 with a narrow notch 50 near the center of the band. The bandlimited noise stimulus 29 is applied to the DUT 24 as described previously in this paper (at a level capable of driving the DUT 24 to its rated average output power). On-channel IMD will appear as noise within the notch. The noise power within the bandwidth of the notch is compared to the noise power in the same bandwidth within the un-notched transmit passband. The resulting ratio is known as the noise-power ratio (NPR).

Existing NPR measurement techniques use an AWG 26 as the signal source. Essentially, the same suite of tones used to execute the adjacent-channel IMD test may be used to execute an in-band IMD test if the AWG 26 code is modified to eliminate M tones at the center of the noise bandwidth. The notch 50 bandwidth is typically selected to be as narrow as possible. In most cases the notch 50 bandwidth is equivalent to that of one channel in an operating system (but not to exceed 20% of the DUT's 24 bandwidth). The integer number of tones M to be deleted for the desired notch 50 bandwidth is described by Equation 1.7:

$$M = \frac{2\pi(NotchBW_{Hz})}{\Delta\omega} \qquad \text{(Eq 1.7)}$$

The suite of N tones is split in the middle, with the lower boundary of the notch 50 corresponding to $n_{lower}$ and the upper boundary of the notch corresponding to $n_{upper}$. The index of the tones corresponding to $n_{lower}$ and $n_{upper}$ is calculated using Equation 1.8:

$$n_{lower} = \left(\frac{N-M}{2}\right) - 1; n_{upper} = \left(N - \left(\frac{N-M}{2}\right)\right) + 1 \qquad \text{(Eq 1.8)}$$

The output signal x(t) is described in Equation 1.9:

$$x(t) = \left(\sum_{n=1}^{n_{lower}} A_n \cdot e^{j(\omega_n t + \phi_n)} + \left(\sum_{n=n_{upper}}^{N} A_n \cdot e^{j(\omega_n t + \phi_n)}\right)\right) \qquad \text{(Eq 1.9)}$$

The phase component $\phi_n$ must be random and independently distributed such that $0 \leq \phi \leq 2\pi$.

Figure 5:
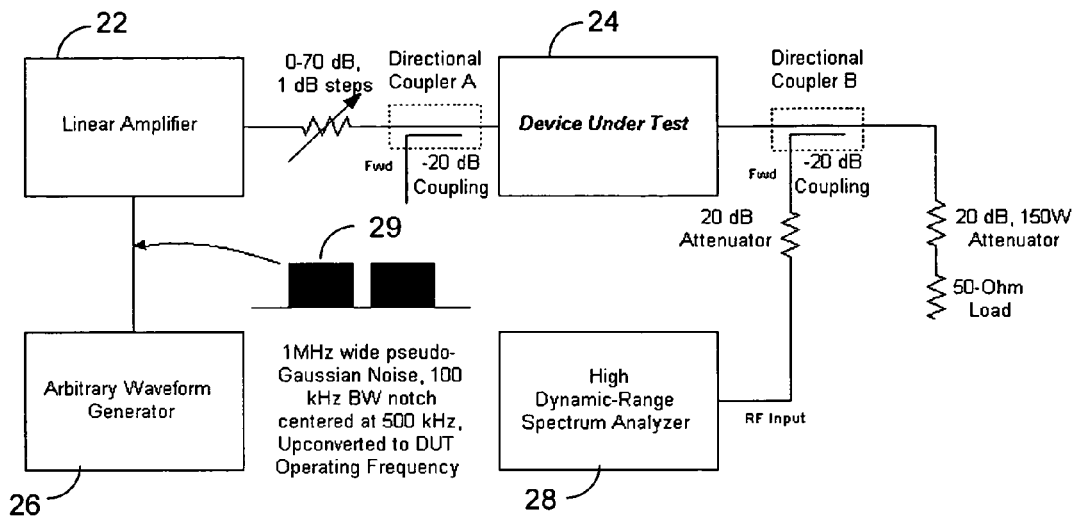
FIG. 5 example noise power ratio measurement configuration.

An NPR test is executed by first characterizing the input stimulus, using a high dynamic-range spectrum analyzer 28 connected to directional coupler A (see FIG. 5). Assuming that the AWG's 26 digital-analog convertor is operating in its linear range (and the power backoff to the optional linear amplifier is sufficient), a notch depth of at least 45-50 dB should be observed. Preferably, the bottom of the notch is maintained well above the spectrum analyzer's 28 noise floor in order for this measurement to be accurate. If desired, a CDF or CDF OR CCDF can be run for the NPR test stimulus. The peak-average power should follow a near-Gaussian distribution.

After characterizing the stimulus 29, it is applied to the DUT 24 with the spectrum analyzer 28 connected to directional coupler B. The power level of the stimulus is increased until $P_{Passband}$ from the DUT 24 is equal to its rated average output power.

The DUT's 24 output signal may be evaluated by a VSA in the time domain using a CDF OR CCDF to determine the device's deviation from a Gaussian distribution. Frequency-domain measurements of integrated noise power within the notch ($P_{Notch}$ 54 in FIG. 4) and the transmitter passband ($P_{Passband}$ 52 in FIG. 4) are easily evaluated using the spectrum analyzer's 28 band-power markers. NPR is defined in Equation 1.10:

$$NPR(db) = \left(P_{Passband}(dBm) - 10\log_{10}\left(\frac{Bandwidth_{Passband}\text{Hz}}{Bandwidth_{Notch}\text{Hz}}\right)\right) - P_{Notch}(dBm) \quad \text{(Eq 1.10)}$$

As was the case with adjacent-channel IMD measurements, NPR can also be evaluated at slightly elevated average power levels in order to determine the relationship between on-channel IMD and the DUT's 1 dB compression point.

Typically, an amplifier's AM/PM distortion has been characterized by means of a continuous wave (CW) tone provided by a vector network analyzer (VNA). For example, a VNA is configured to generate a variable-power level CW signal which is used as a stimulus for the DUT, and the VNA samples and records the output signal's amplitude and phase relative to the input signal. Using this method, it is relatively uncomplicated to determine the amount of AM-AM and AM-PM distortion in the DUT. However, since this test is executed using a CW signal, the results may not be relevant when applied to a multitone environment. Consequently, the DUT should be presented with a stimulus that exhibits a peak-average ratio that closely replicates that of the actual signal, in order to simulate the dynamic conditions present in a multitone environment. For example, peak power transients may cause loading changes within the DUT, with a resulting phase shift at the output of the device. A relatively simple means of executing a dynamic AM-AM and AM-PM test is shown in FIG. 6.

In this test, an NPR stimulus from an AWG 26 is used to drive the DUT 24 to full average output power with a peak power distribution approximating a Gaussian distribution. A 16QAM test signal 78 is generated by a vector signal generator 24, and its carrier frequency is selected such that is placed in the center of the NPR notch. A constellation diagram of the 16QAM signal within the notch is monitored by the Vector Signal Analyzer. Amplitude and phase shifts in the four outer corners of the constellation are used to quantify the amplifier's AM-AM and AM-PM distortion.

Figure 6:
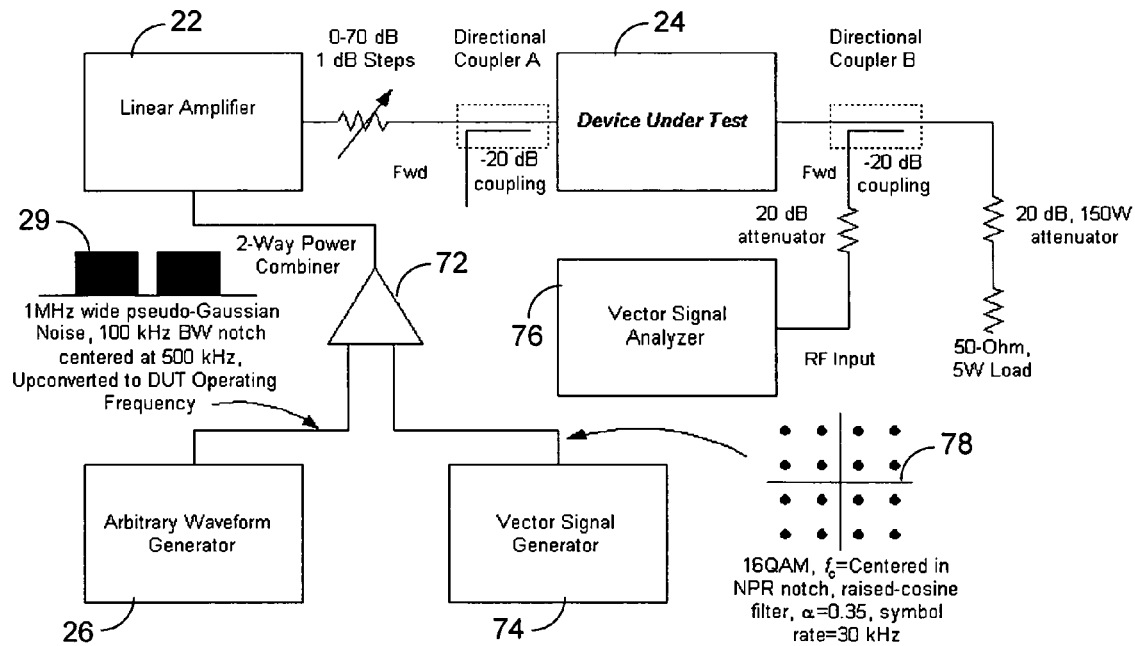
FIG. 6 example AM-PM test configuration.

This test begins with the equipment configured as shown in FIG. 6, and the Vector Signal Analyzer 76 connected to directional coupler A. The 16 QAM 78 constellation is monitored, and any phase shift or amplitude compression in the outer constellation points is noted. Next, the VSA 76 is moved to directional coupler B, with the DUT 24 operating a reduced average input power level in order to keep it well within its linear operating range (e.g. backoff of about 10 dB). Any phase shift or amplitude compression in the outer constellation points is noted. The power level of the stimulus is increased to provide the rated average power of the DUT 24, and any amplitude and phase errors at the four corner constellation points (relative to the baseline established previously) are noted. Amplitude error (in dB) and phase error (in degrees) can be read directly for any point in the constellation, and AM-PM curves established for a range of input levels.

The multitone environment will likely become the norm for all future communications systems. Unlike the single-channel environment, multitone signals bring with them a host of challenges related to the measurement of intermodulation distortion and amplifier linearity. Differences in the IMD environment have been described herein, as well as a metrology employing Gaussian synthesis techniques. The methods an apparatus described herein are readily adaptable to providing accurate, repeatable measurements of key performance metrics in any multitone amplifier or subsystem.

While the present invention has been described in connection with the preferred embodiments of the various Figures, it is to be understood that other similar embodiments may be used or modifications and additions may be made to the described embodiment for performing the same function of the present invention without deviating therefrom. For example, one skilled in the art will recognize that the present invention as described in the present application may apply to various types of amplifiers and devices that use amplifiers, whether wired or wireless, and may be applied to any number of such devices. Therefore, the present invention should not be limited to any single embodiment, but rather should be construed in breadth and scope in accordance with the appended claims.

What is claimed is:

1. A method, comprising:
inputting a stimulus signal approximating a Gaussian noise signal limited to a frequency band into an amplifier wherein said stimulus signal comprises a notch in a portion of said frequency band and wherein the stimulus signal comprises a plurality of frequency spaced tones where the number of tones is a function of the bandwidth of the frequency band;
measuring amplitude and phase distortion in the notch portion of said frequency band from the output of the amplifier; and
recording the measured amplitude and phase distortion.

2. The method as recited in claim 1 wherein the phases of the plurality of frequency spaced tones are random.

3. The method as recited in claim 1 wherein the stimulus signal is upconverted approximately in an operating frequency range of the amplifier.

4. The method as recited in claim 1 comprising increasing the power level of the stimulus until the passband power from the amplifier is approximately the same as its rated average output power.

5. The method as recited in claim 1 comprising measuring the on channel intermodulation distortion by measuring the noise power ratio within the notch of the stimulus signal.

6. The method as recited in claim 5 comprising inputting a test signal of at least 16QAM approximately in the center of the notch and monitoring the amplitude and phase shifts in the outer corners of the test signal of at least 16QAM.

7. The method as recited in claim 1 wherein the amplifier is a linear power amplifier.

8. A system, comprising:
an arbitrary waveform generator that generates a stimulus signal approximating a Gaussian noise signal limited to a frequency band into an amplifier wherein said stimulus signal comprises a notch in a portion of said frequency band and wherein the stimulus signal comprises a plurality of frequency spaced tones where the number of tones is a function of the bandwidth of the frequency band; and
a spectrum analyzer that measures amplitude and phase distortion in the notch portion of the frequency band from the output of the amplifier.

9. The system as recited in claim 8 wherein the phases of the plurality of frequency spaced tones are random.

10. The system as recited in claim 8 comprising an upconverter for upconverting the stimulus signal approximately in an operating frequency range of the amplifier.

11. The system as recited in claim 8 comprising a mechanism for increasing the power level of the stimulus so that the passband power from the amplifier is approximately equal to its rated average output power.

12. The system as recited in claim 8 comprising a vector signal generator configured to input a test signal of at least 16QAM approximately in the center of the notch.

13. A system, comprising:
   means for generating a stimulus signal approximating a Gaussian noise signal limited to a frequency band into an amplifier wherein stimulus signal comprises a notch in a portion of said frequency band and wherein the stimulus signal comprises a plurality of frequency spaced tones where the number of tones is a function of the bandwidth of the frequency band; and
   means for measuring amplitude and phase distortion in the notch portion of the frequency band from the output of the amplifier.

14. The system as recited in claim 13 comprising means for measuring the on channel intermodulation distortion by measuring the noise power ratio within the notch of the stimulus signal by inputting a test signal of at least 16QAM approximately in the center of the notch and monitoring the amplitude and phase shifts in the outer corners of the test signal of at least 16QAM.

15. The system as recited in claim 13 wherein the phases of the plurality of frequency spaced tones are random.

16. The system as recited in claim 13 comprising an upconverter for upconverting the stimulus signal approximately in an operating frequency range of the amplifier.

17. The system as recited in claim 13 comprising a mechanism for increasing the power level of the stimulus so that the passband power from the amplifier is approximately equal to its rated average output power.

18. The system as recited in claim 13 wherein the amplifier comprises a linear amplifier.

\* \* \* \* \*